United States Patent
Kim

[11] Patent Number: 5,994,223
[45] Date of Patent: Nov. 30, 1999

[54] METHOD OF MANUFACTURING ANALOG SEMICONDUCTOR DEVICE

[75] Inventor: Jae-Kap Kim, Ich'on, Rep. of Korea

[73] Assignee: Hyundai Electronics Industries Co., Ltd., Ich'on, Rep. of Korea

[21] Appl. No.: 08/997,423

[22] Filed: Dec. 23, 1997

[30] Foreign Application Priority Data

Dec. 30, 1996 [KR] Rep. of Korea ..................... 96-77776

[51] Int. Cl.$^6$ ................................................. H01L 21/00
[52] U.S. Cl. ........................................... 438/689; 438/694
[58] Field of Search .................. 438/689, 699, 438/706, 723, 622, 695, 694

[56] References Cited

U.S. PATENT DOCUMENTS

| | | | |
|---|---|---|---|
| 5,173,437 | 12/1992 | Chi | 438/253 |
| 5,330,883 | 7/1994 | Garza | 430/513 |
| 5,354,706 | 10/1994 | Patrick | 438/585 |
| 5,358,903 | 10/1994 | Kim | 438/622 |
| 5,773,199 | 6/1998 | Linliu et al. | 438/706 |

*Primary Examiner*—Benjamin Utech
*Assistant Examiner*—Kin-Chan Chen
*Attorney, Agent, or Firm*—Ware, Fressola, Van Der Sluys & Adolphson LLP

[57] ABSTRACT

The present invention to provide a method of manufacturing an analog semiconductor device capable of minimizing the CD variation of a gate and improving the integration of a semiconductor device. First, a semiconductor substrate in which isolation films are formed is provided. A gate insulating layer, a first conductive layer, a dielectric layer and a second conductive layer are then formed on the substrate in sequence. Next, a first photoresist pattern is formed on the predetermined portion of the second conductive layer. The second conductive layer and the dielectric layer are then patterned using the first pattern as an etch mask, to form a first pattern for gate electrode on the substrate between the isolation films and form a second pattern for a lower capacitor electrode on the predetermined portion of the isolation film. Next, the first photoresist pattern is removed and a second photoresist pattern for an upper capacitor electrode is then formed on the second pattern. The second conductive layer of the first and second patterns and the exposed first conductive layer at both sides of the first and second patterns are etched using the dielectric layer, the gate insulating layer and the isolation films as an etch stopper and then the second photoresist pattern is removed.

11 Claims, 3 Drawing Sheets

METHOD OF MANUFACTURING ANALOG SEMICONDUCTOR DEVICE

BACKGROUND OF THE INVENTION

1. Field of the Invention

The present invention relates to a method of manufacturing a semiconductor device, and more particularly to a method of manufacturing an analog semiconductor device.

2. Discussion of Related Art

An analog semiconductor device stores data of various states in contrary to a digital semiconductor device having data of low and high states. In the analog semiconductor device, a resistor and a capacitor are provided each node thereof. This capacitor includes a lower capacitor electrode, an insulating layer formed on the lower capacitor electrode, and an upper capacitor electrode formed on the insulating layer.

Referring to FIGS. 1A, 1B, 1C, a conventional method of manufacturing an analog semiconductor device will be described.

As shown in FIG. 1A, isolation films 2 are formed on a semiconductor substrate 1 and then gate insulating layer 3 and a first conductive layer 4 are formed thereon. An insulating layer 5 is formed on the first conductive layer 4 to act as a dielectric of a capacitor, and a second conductive layer 6 is then formed thereon. Next, a first photoresist pattern 7 is formed on the second conductive layer 6 by photolithography.

As shown in FIG. 1B, the second conductive layer 6 and the insulating layer 5 are etched by etching process using the first photoresist pattern 7 as an each mask, thus forming an upper capacitor electrode 6a. Next, the first photoresist pattern 7 is removed and a second photoresist layer 8 is coated on the entire surface of the substrate. As shown in FIG. 1C, the second photoresist layer 8 is patterned to form a second photoresist pattern 8a.

Afterward, although not shown in drawing, the first conductive layer 4 is etched by etching process using the second photoresist pattern 8a as an etch mask, thus patterning the gate and lower capacitor electrodes. Therefore, the gate is formed on the substrate between the isolation films 2, and capacitor are formed on the predetermined portion of the isolation films 2.

Meanwhile, as a design rule semiconductor devices decrease below half-micron, patterning conditions for the gate are difficult more and more. Therefore, if there is a little bit of a change in the patterning conditions, a critical dimension (CD) of the gate varies significantly. One of the main factors due to the CD variation of the gate is the thickness variation of the photoresist layer acting as a mask during patterning the gate. The thickness of the photoresist layer varies with the surface topology of underlayer. The thickness variation of the photoresist layer increases the CD variation of the gate.

In the conventional method of manufacturing the analog semiconductor device as described above, as shown in FIGS. 1B and 1C, the thickness of the second photoresist layer 8 varies since the surface topology property is deteriorated dud to the upper capacitor electrode 6a. Therefore, the CD variation of the gate increases. To overcome this problem, although the space between the gate and the capacitor is proposed to enhance the surface topology property, this decreases the integration of a semiconductor device.

SUMMARY OF THE INVENTION

Accordingly, it is an object of the present invention to provide a method of manufacturing an analog semiconductor device capable of minimizing the CD variation of a gate and improving the integration of a semiconductor device.

To achieve the above described object, the analog semiconductor device according to the present invention is manufactured by the following processes. First, a semiconductor substrate in which isolation films are formed is provided. A gate insulating layer, a first conductive layer, a dielectric layer and a second conductive layer are then formed on the substrate in sequence. Next, a first photoresist pattern is formed on the predetermined portion of the second conductive layer. The second conductive layer and the dielectric layer are then patterned using the first pattern as an etch mask, to form a first pattern for gate electrode on the substrate between the isolation films and form a second pattern for a lower capacitor electrode on the predetermined portion of the isolation film. Next, the first photoresist pattern is removed and a second photoresist pattern for an upper capacitor electrode is then formed on the second pattern. The second conductive layer of the first and second patterns and the exposed first conductive layer at both side of the first and second patterns are etched using the dielectric layer, the gate insulating layer and the isolation films as an etch stopper and then the second photoresist pattern is removed.

According to the present invention, as the first conductive layer for the lower capacitor and gate electrodes and the second conductive layer for the upper capacitor electrode are formed in sequence, the gate electrode are formed prior to the upper capacitor electrode. Therefore, photoresist pattern is uniformly formed on the second conductive layer without varying its thickness whereby the underlayer is patterned to a uniform thickness. In result, the CD variation of the gate is minimized.

DETAILED DESCRIPTION OF THE PRESENT INVENTION

Hereinafter, a preferred embodiment of the present invention will be explained in more detail with reference to the accompanying drawings.

FIGS. 2A, 2B, 2C, 2D, 2E are cross sectional views showing a method of manufacturing an analog semiconductor device according to a preferred embodiment of the present invention.

Figure 1A:
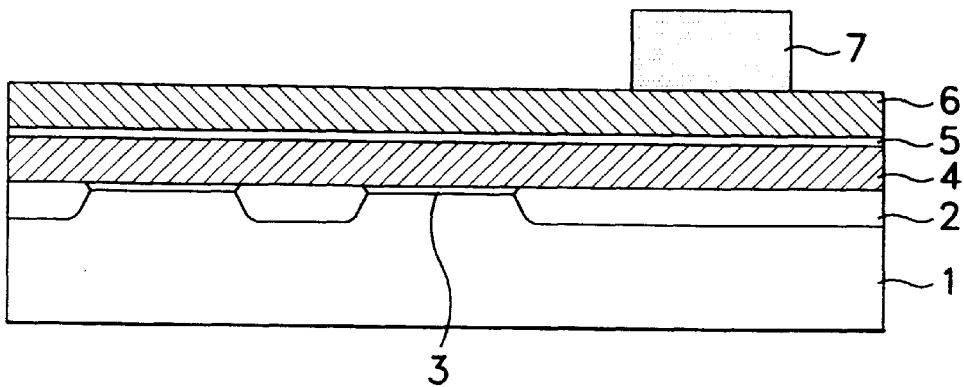
FIGS. 1A, 1B, 1C, are cross sectional views showing a conventional method of manufacturing an analog semiconductor device.
Figure 1B:
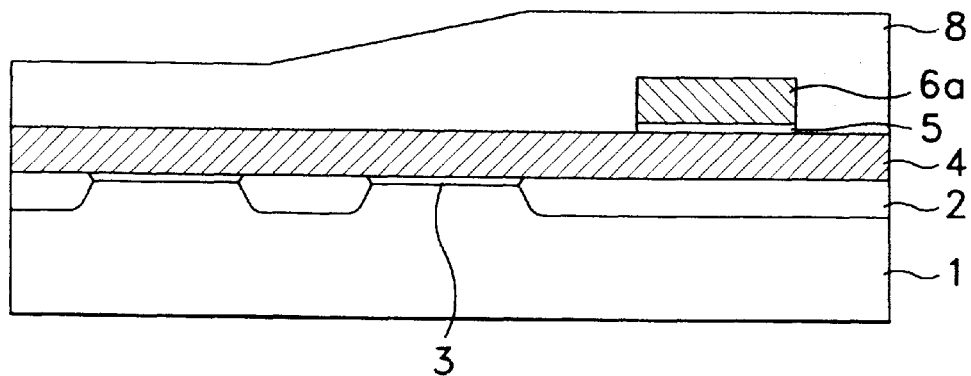
Figure 1C:
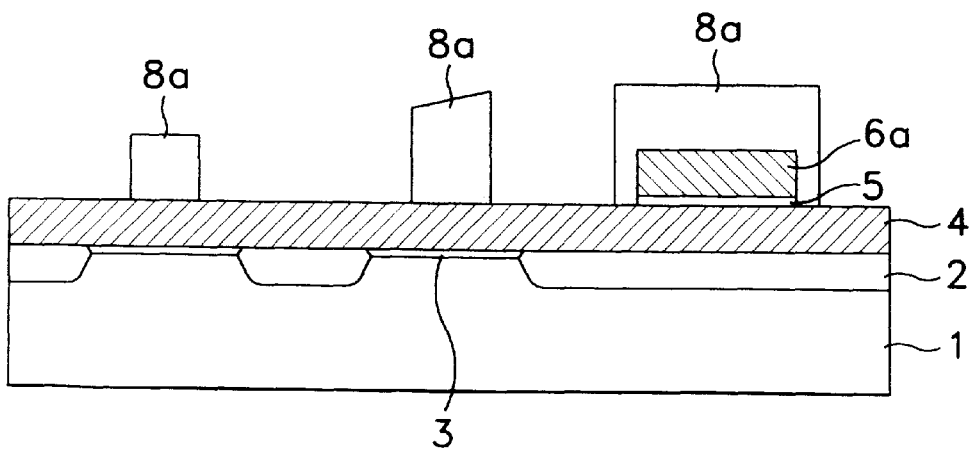
Figure 2A:
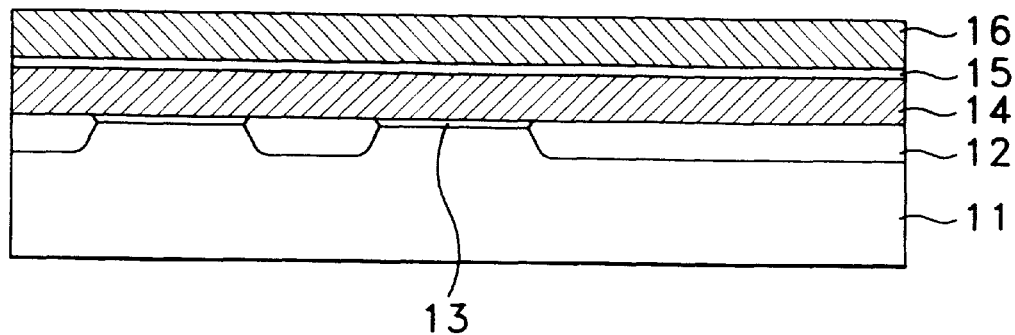
FIGS. 2A, 2B, 2C, 2D, 2E are cross sectional views showing a method of manufacturing an analog semiconductor device according to a preferred embodiment of the present invention.

Referring to FIG. 2A, isolation films 12 are formed on a semiconductor substrate 11 by a well-known method and a gate insulating layer 13 and a first conductive layer 14 for a gate electrode are then formed thereon. The first conductive layer 14 is one selected from the group consisting of polysilicon layer, amorphous silicon layer and a stacked layer of silicon and metal-silicide layer. Next, an insulating layer 15 is formed on the first conductive layer 14 to act as a dielectric of capacitor and a second conductive layer 16 for an upper capacitor electrode is formed on the insulating layer 15. The insulating layer 15 is silicon oxide layer or a stacked layer of silicon nitride layer and silicon oxide layer. The second conductive layer 16 is one selected from the group of polysilicon layer, amorphous silicon layer and a stacked layer of silicon and metal-silicide layer. In case the polysilicon layer or amorphous silicon layer is used as the first or second conductive layer 14 or 16, it is doped by in-situ. Alternatively, an Anti-Reflective Coating(ARC) layer (not shown) such as silicon nitride or oxynitride can be formed on the second conductive layer 16.

Figure 2B:
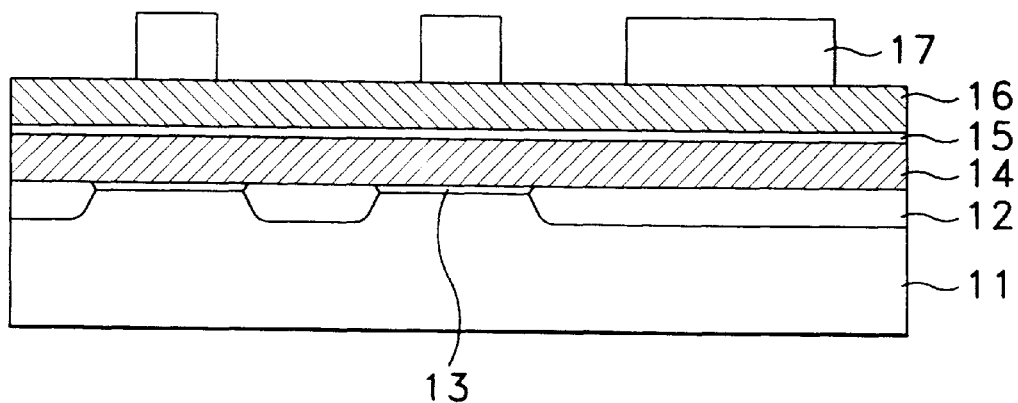

Referring to FIG. 2B, a first photoresist pattern 17 is formed on the second conductive layer 16 by photolithography. At this time, owing to the good surface topology of underlayer as shown in FIG. 2B, the first photoresist pattern 17 is formed uniformly without varying its thickness.

Figure 2C:
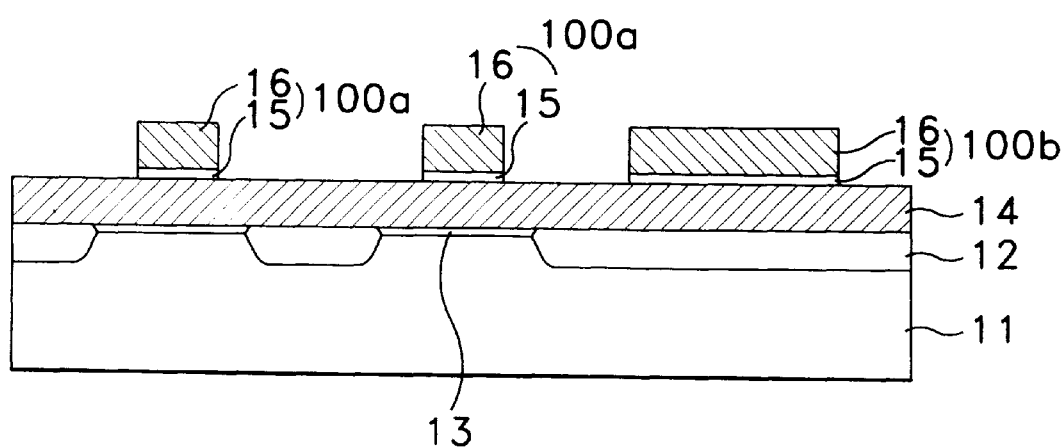
Figure 2D:
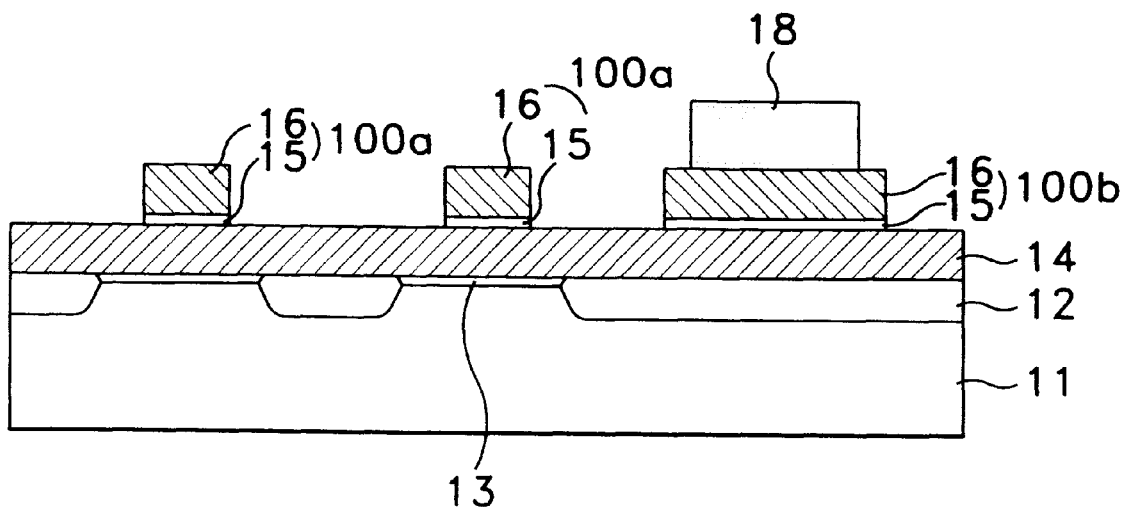

Referring to FIG. 2C, the second conductive layer 16 and the insulating layer 15 are etched by etching process using the first photoresist pattern 17 as an etch mask. Therefore, a first pattern 100a for forming gate electrodes and a second pattern 100b for forming a lower capacitor electrode are formed on the first conductive layer 14. The first photoresist pattern 17 (refer to FIG. 2B) is then removed by a well known method. Next, as shown in FIG. 2D, a second photoresist pattern 18 is formed on the second pattern 100b by photolithography.

Figure 2E:
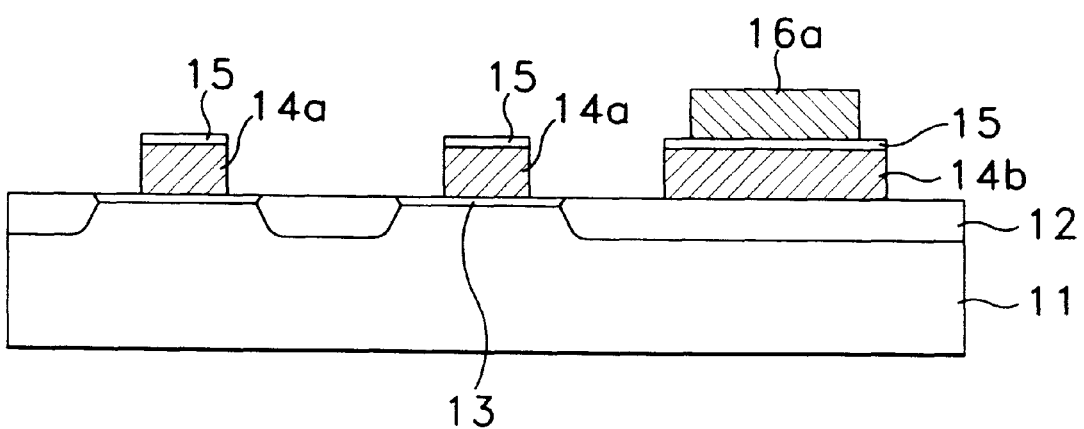

Afterward, the second conductive layer 16 of the first and second patterns 100a and 10b, and the exposed portions of first conductive layer 14 at both sides of the first and second patterns 100a and 10b, are etched by etching process using the gate insulating layer 13, the isolation films 12 and the insulating films 12 as an etch stopper. Accordingly, as shown in FIG. 2E gate electrodes 14a are formed on the substrate between the isolation films 12. In addition, a lower capacitor electrode 14b and an upper capacitor electrode 16a are formed on the predetermined portion of the insulation film 12, to thereby form a capacitor. Next, the second photoresist pattern 18 (refer to FIG. 2D) is removed by a well-known method. The insulating layers 15 existing on the gate electrodes 14a and the gate insulating layer 13 positioned at both sides of the gate electrodes 14a are removed. Alternatively, this process may be performed after removing the second photoresist pattern 18 or prior to removing it.

According to the above described embodiment, as the first conductive layer for the lower capacitor and gate electrodes and the second conductive layer for the upper capacitor electrode are formed in sequence, the gate electrode are formed prior to the upper capacitor electrode. Therefore, photoresist pattern is uniformly formed on the second conductive layer without varying its thickness whereby the underlayer is patterned to a uniform thickness. In result, the CD variation of the gate is minimized.

Furthermore, it is not necessary that the space between the gate and the capacitor increases for the purpose of enhancing the surface topology property, to thereby improving the integration of the semiconductor device.

While this invention has been described with reference illustrative embodiments, this description is not intended to be construed in a limiting sense. Various modifications of illustrative embodiments, as well as other embodiments of the invention, will be apparent to persons skilled in the art upon reference to this description. It is therefore contemplated that the appended claims will cover any such modifications of embodiments as falling within the true scope of the invention.

What is claimed is:

1. A method of manufacturing an analog semiconductor device comprising the steps of:

providing a semiconductor substrate in which isolation films are formed;

forming a gate insulating layer, a first conductive layer, a dielectric layer and a second conductive layer on the substrate in sequences;

forming a first photoresist layer having a first pattern and a second pattern on a portion of the second conductive layer;

etching to form the first pattern and the second pattern of the second conductive layer and the dielectric layer using the first photoresist layer as an etch mask;

removing the first photoresist layer;

forming a second photoresist layer having a third pattern on top of the second pattern of the second conductive layer;

etching the second conductive layer using the first pattern and the second pattern of the dielectric layer, the gate insulating layer and the isolation film as an etch stopper and the second photoresist as an etch mask to form a gate electrode consisting the first pattern of the first conductive layer under the first pattern of the dielectric layer and to form a lower capacitor electrode consisting the second pattern of the first conductor layer and the dielectric layer and the third pattern of the second conductive layer; and removing the second photoresist layer.

2. The method as claimed in claim 1, wherein the first conductive layer is polysilicon layer.

3. The method as claimed in claim 1, wherein the first conductive layer is amorphous silicon layer.

4. The method as claimed in claim 1, wherein the first conductive layer is a stacked layer of silicon layer and metal-silicide layer.

5. The method as claimed in claim 1, wherein the dielectric layer is silicon oxide layer.

6. The method as claimed in claim 1, wherein the dielectric layer is a stacked layer of silicon nitride layer and silicon oxide layer.

7. The method as claimed in claim 1, wherein the second conductive layer is polysilicon layer.

8. The method as claimed in claim 1, wherein the second conductive layer is amorphous silicon layer.

9. The method as claimed in claim 1, wherein the second conductive layer is a stacked layer of silicon layer and metal-silicide layer.

10. The method as claimed in claim 1, further comprising the step of removing the exposed dielectric layer and the gate insulating layer prior to removal of the second photoresist pattern.

11. The method as claimed in claim 1, further comprising the step of removing the exposed dielectric layer and the gate insulating layer after removal of the second photoresist pattern.

* * * * *

UNITED STATES PATENT AND TRADEMARK OFFICE
CERTIFICATE OF CORRECTION

PATENT NO : 5,994,223
DATED : Nov. 30, 1999
INVENTOR(S): J. Kim

It is certified that error appears in the above-identified patent and that said Letters Patent is hereby corrected as shown below:

At col. 3, line 23, please cancel "10b" and substitute --100b-- therefor; and at line 25, please cancel "10b" and substitute --100b-- therefor.

Signed and Sealed this

Eighth Day of August, 2000

Attest:

Q. TODD DICKINSON

Attesting Officer

Director of Patents and Trademarks